United States Patent
Lee et al.

(10) Patent No.: US 6,933,236 B2
(45) Date of Patent: *Aug. 23, 2005

(54) METHOD FOR FORMING PATTERN USING ARGON FLUORIDE PHOTOLITHOGRAPHY

(75) Inventors: Sung-Kwon Lee, Ichon-shi (KR);
Sang-Ik Kim, Ichon-shi (KR);
Weon-Joon Suh, Ichon-shi (KR)

(73) Assignee: Hynix Semiconductor Inc., Gyunggi-Do (KR)

( * ) Notice: Subject to any disclaimer, the term of this patent is extended or adjusted under 35 U.S.C. 154(b) by 276 days.

This patent is subject to a terminal disclaimer.

(21) Appl. No.: 10/306,084

(22) Filed: Nov. 27, 2002

(65) Prior Publication Data

US 2003/0114012 A1 Jun. 19, 2003

(30) Foreign Application Priority Data

Nov. 30, 2001 (KR) ........................................ 2001-75228

(51) Int. Cl.[7] ...................... H01L 21/461; H01L 21/311
(52) U.S. Cl. ...................... 438/695; 438/695; 438/696; 438/725; 438/732; 438/735; 438/742; 438/743; 438/744; 438/909; 438/952; 430/313; 430/314; 216/49; 216/67; 216/79; 216/80
(58) Field of Search .............................. 216/49, 67, 79, 216/80; 438/714, 725, 732, 735, 742, 743, 744, 909, 952, 695, 696, 477; 430/5, 270.1, 320, 325, 311, 313, 314

(56) References Cited

U.S. PATENT DOCUMENTS 5,910,453 A * 6/1999 Gupta et al. ................. 438/717
6,316,349 B1 * 11/2001 Kim et al. ................... 438/637
6,376,384 B1   4/2002 Yen et al.
6,569,778 B2 * 5/2003 Lee et al. .................... 438/734
6,774,043 B2 * 8/2004 Yamaguchi et al. ........ 438/705

FOREIGN PATENT DOCUMENTS

JP    2002-075975    3/2002

OTHER PUBLICATIONS

Rossnagel et al., Handbook of Plasma Processing Technology, 1990, Noyes Publications, pp. 17–20, 198, 209.*
Wolf et al., Silicon Processing for the VLSI Era, Lattice Press, 1986, vol. 1, pp. 182–183.*

* cited by examiner

*Primary Examiner*—Nadine G. Norton
*Assistant Examiner*—Eric B. Chen
(74) *Attorney, Agent, or Firm*—Marshall, Gerstein & Borun LLP

(57) ABSTRACT

A method for forming a photoresist pattern with minimally reduced transformations through the use of ArF photolithography, including the steps of: forming an organic anti-reflective coating layer on a an etch-target layer already formed on a substrate; coating a photoresist for ArF on the organic anti-reflective coating layer; exposing the photoresist with ArF laser; forming a first photoresist pattern by developing the photoresist, wherein portions of the organic anti-reflective coating layer are revealed; etching the organic anti-reflective coating layer with the first photoresist pattern as an etch mask and forming a second photoresist pattern by attaching polymer to the first photoresist pattern, wherein the polymer is generated during etching the organic anti-reflection coating layer with an etchant including $O_2$ plasma; and etching the etch-target layer by using the second photoresist pattern as an etch mask.

13 Claims, 2 Drawing Sheets

METHOD FOR FORMING PATTERN USING ARGON FLUORIDE PHOTOLITHOGRAPHY

TECHNICAL FIELD

A method for fabricating a semiconductor device and, more particularly, a method for forming a photoresist pattern using ArF photolithography is disclosed.

DESCRIPTION OF THE RELATED ART

Photolithography technology contributes to progression of a semiconductor device development. Thus, improving the resolution of photolithography techniques is critical and directly related to further progression in integration of semiconductor devices.

Currently, photo-etching processes include a process for forming a photoresist pattern and a process for forming a pattern in a preferred form, e.g., a contact hole by etching a etch-target layer through an etching process with use of the photoresist pattern as an etching mask. The photoresist pattern is formed through a series of processes in an order as the following: a process for coating a photoresist on a etch-target layer; a photo exposure process for exposing the photoresist with a mask; and a process for developing the photoresist with a chemical solution.

Meanwhile, a critical dimension (hereinafter referred as to CD) of a pattern formed by the photo-etching process depends on wavelengths of a light sources used in the exposing process, because the width of the photoresist pattern established through the photo-etching process determines the CD of the actual pattern.

A stepper is a piece of photo exposure equipment, which takes a photo exposure type of "step and repeat" using wavelengths of a light source in a range from 436 nm (g-line) to 365 nm (i-line) in an initial stage of the practice. Currently, a stepper that uses a deep ultra violet (DUV) of a wavelength of 248 nm (KrF Excimer Laser) or scanner type photo exposure equipment is generally used. The photo-etching technique that uses the DUV of the wavelength in 248 nm initially has several problems of a time delay, a substrate dependence and so forth, resulting in numerous attempts to develop new types of photo exposure equipments that allow the pattern size to be variable for broad applications.

For instance, another development of a photo exposure equipment having 0.18 μm of a pattern size was developed to solve the above-mentioned problems. In addition, in order to develop the photo exposure equipment applicable to a pattern size less than 0.15 μm, it is compulsory to develop a new DUV photo etching technology having a wavelength of 193 nm (ArF excimer laser). However, although other various techniques are combined together to improve resolution of the new DUV photo etching technique, it is difficult to obtain a pattern size less than 0.1 μm. Therefore, efforts have been made to develop an etching process with a new light source.

Specifically, efforts have begun to develop photo exposure equipment using ArF excimer laser of which wavelength is in 193 nm so as to attain a pattern size ranging from about 0.07 μm to about 0.11 μm. The DUV photo-etching technique is superior in an i-line resolution and depth of focus(DOF), however, it is difficult to control the process. This problem results from an optical aspect caused by using a short wavelength and a chemical aspect caused by using a chemical amplification type resist. A CD fluctuation phenomenon due to a standing wave effect and an exposure phenomenon by a reflected light due to a substrate phase becomes more severe as the operating wavelength becomes shorter. The CD fluctuation causes a periodic change in the thickness of the line. A degree of interference between an incident light and a reflected light fluctuates in accordance with a micro-difference in the thickness between resists or substrate films.

In the DUV process, a chemical amplification type of resist must be used to improve sensitivity. However, there are several problems with respect to reaction mechanisms in post exposure delay (PED) safety, a substrate dependence and so forth. Hence, one of key goals of the photo exposure technique is to develop a resist for use of ArF.

The ArF resist is a chemical amplification type as like KrF, but a material to be used with the ArF resist is necessary. It is, however, difficult to improve properties of the material since a benzene ring cannot be used. The benzene ring is employed to the i-line and the KrF resist to provide tolerance to a dry etching. However, if a benzene ring is used in the ArF resist, it is impossible to obtain a photo exposure from a bottom part of the ArF resist due to a decrease of transparency caused by increasing absorbance at 193 nm of the ArF excimer laser. Therefore, the current focus is on the development of a material that provides tolerance to the dry etching and has a good adhesiveness with an ability to be developed in tetra-methyl ammonium hydroxide TMAH. Many companies and research institutes have been reported their studies on developments of the material having such effects.

For instance, a resist in a form of commonly used cycloolefin-maleic anhydride (COMA) or acrylate based polymer, or mixtures of the COMA and the polymer has the benzene ring structure.

However, striations occur in the pattern during the process for forming a landing plug contact (hereinafter referred as to LPC) through a photo-etching process with use of the ArF photolithography or clusters of a photoresist (PR) and plastic deformation during a self align contact (hereinafter referred as to SAC) etching process or shifts to one side due to low tolerance of the PR during the SAC etching process. Yet, there may present potential disputes on other various possible interpretations for these phenomena.

Accordingly, the low etch tolerance of the ArF resist and low materialistic properties should be complemented.

SUMMARY OF THE DISCLOSURE

A method for forming a photoresist pattern with ArF photolithography is disclosed which is capable of minimizing transformations of the photoresist pattern for use of ArF.

More specifically, a method for forming a pattern of semiconductor device is disclosed which comprises: forming an organic anti-reflective coating layer on a an etch-target layer already formed on a substrate; coating a photoresist for ArF on the organic anti-reflective coating layer; exposing the photoresist with ArF laser; forming a first photoresist pattern by developing the photoresist, wherein portions of the organic anti-reflective coating layer are revealed; etching the organic anti-reflective coating layer with the first photoresist pattern as an etch mask and forming a second photoresist pattern by attaching polymer to the first photoresist pattern, wherein the polymer is generated during etching the organic anti-reflection coating layer with an etchant including $O_2$ plasma; and etching the etch-target layer by using the second photoresist pattern as an etch mask.

DETAILED DESCRIPTION OF THE PRESENTLY PREFERRED EMBODIMENTS

With reference to FIGS. 1 to 4, the preferred embodiment will be described in more detail.

Figure 1:
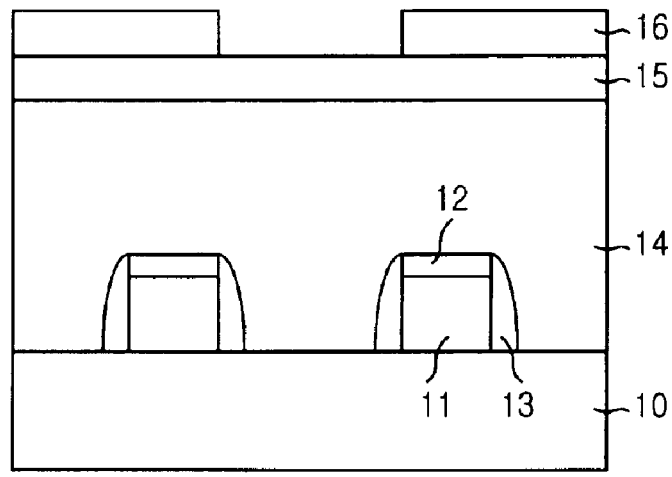
FIGS. 1 to 4 are cross-sectional views illustrating a photoresist pattern formation process through the use of ArF photolithography in accordance with a preferred embodiment.

Referring to FIG. 1, a number of conductive patterns such as gate electrodes 11 are formed on a substrate 10 including various constructional elements. Instead of the gate electrode 11, a bit line or a metal line having multi-layer structure can be formed.

That is, a gate oxide layer (not shown) is formed on an interface between the substrate 10 and the gate electrode 11. The gate electrode 11 is formed with stacked layers such as a polysilicon layer/a tungsten silicide layer, or a polysilicon layer/a tungsten layer. A hard mask 12 is formed with a nitride film on the gate electrode 11 for preventing losses of the gate electrode 11 due to a subsequent self align contact (hereinafter referred as to SAC) etching process.

Subsequently, an insulating layer for a spacer is deposited on a whole surface of the substrate 10 including the gate electrode 11 and the hard mask 12. Herein, the insulating layer is formed of nitride layer. Explicitly, the insulating layer for the use of the spacer is deposited till reaching a thickness in a range of from about 50 Å to about 500 Å.

After the deposition of the insulating layer, a spacer 13 is formed on lateral sides of the gate electrode 11 by an conventional etch back process.

Thereafter, an etch-target layer 14 is formed on a whole surface of the above described structure. The etch-target layer 14 is formed of oxide films such as an advanced planarization layer (APL) oxide film, boro phospho silicate glass, spin on glass, or a high density plasma oxide film and so forth.

Next, an organic anti-reflective coating layer 15 is formed on the etch-target layer 14, and a photoresist for ArF is coated thereon, and a photoresist pattern 16 is formed by ArF photolithography. In particular, cycloolefin-maleic anhydride (COMA) or acrylate is coated on the organic anti-reflective coating layer 15. A preset portion of the photoresist is selectively exposed through the use of ArF photolithography and a predetermined number of radicals (not shown), and a photoresist pattern 16 is obtained by a developing process and a eliminating residues produced from the developing process by a cleaning process.

Figure 2:
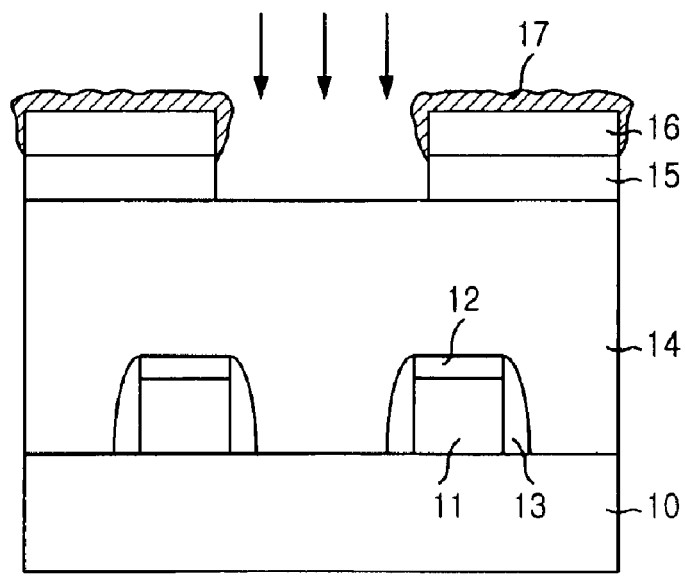

Referring to FIG. 2, a surface of the etch-target layer 14 is exposed through a selective etching of the anti-reflective coating layer 15. Then, an adhesion of a polymer 17 on a surface of the photoresist pattern 16 is proceeded by providing etching conditions for producing a polymer 17.

In more detail, etch recipes vary in accordance with a type of device for etching. In the preferred embodiment of the present invention, a etching machine manufactured by AMAT company is adopted. Other device capable of providing induced coupled plasma(ICP), electro cyclotron resonance(ECR) or reactive ion etching(RIE) can be used.

The polymer 17 is produced through the use of plasma wherein $O_2/N_2$ gas is employed as a main etching gas and power and pressure are controlled in a range from about 200 W to about 500 W and about 10 mTorr to about 100 mTorr, respectively. In this case, the flow quantity of $O_2$ ranges from about 10 SCCM to about 50 SCCM whereas the flow quantity of $N_2$ ranges from about 100 SCCM to about 2000 SCCM. The polymer 17 produced by the above-described procedure includes carbon, fluoride and hydrogen gas, improving repeatability of the inventive process by protecting the photosensitive sensitive pattern 16 during etching the etch-target layer 14. Moreover, it is possible to form a pattern of which space becomes narrow as an identical degree of increase in the thickness of the polymer 17.

On the other hand, in case of etching the organic anti-reflective coating layer is performed with $CF_4/CO/Ar/O_2$ gas under conditions in which power and pressure are in a range from about 100 W to about 500 W and from about 10 mTorr to about 100 mTorr, respectively and a flow quantity of $O_2$ is in a range from about 10 SCCM to about 50 SCCM. A flow quantity of $CF_4$ is in a range from about 50 SCCM to about 150 SCCM, a flow quantity of Ar is in a range from about 100 SCCM to about 500 SCCM and a flow quantity of CO in a range from about 10 SCCM to about 50 SCCM.

Furthermore, duration time for the etching and temperature are controlled in appropriate conditions to form the polymer 17 in a certain thickness. At this time, the temperature of the substrate 10 is maintained in a range from about −10 C. to about 10° C.

Figure 3:
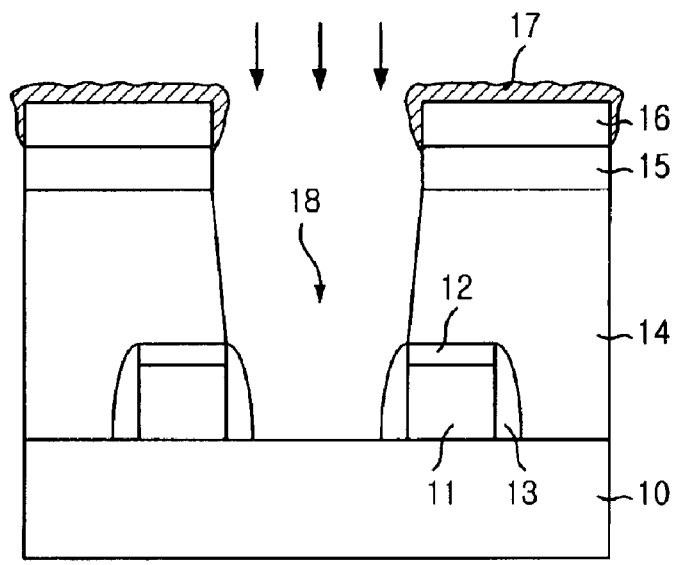

Next, as shown in FIG. 3, the etch-target layer 14 is selectively etched by taking the photoresist pattern 16 including the polymer 17 as a mask.

Concretely, the etching process is operated in the following conditions: a temperature of the substrate 10 is appropriately maintained; $C_4F_6$ is employed as a main etching gas; power and pressure are controlled in a range from about 800 W to about 1700 W and about 20 mTorr to about 100 mTorr, respectively; and $O_2$, Ar, Xe or He gas is added to the main etching gas to attain an etching profile and safety. Herein, it is preferable to have a ratio of using the main etching gas to $O_2$ gas ranges from about 1.0:1 to about to 3.0:1.

It is also possible to add $CH_2F_2$, and flow quantities of $O_2$, Ar and $CH_2F_2$ is preferably controlled in a range from about 5 SCCM to about 50 SCCM, from about 100 SCCM to from about 1000 SCCM and from about 1 SCCM to about 10 SCCM, respectively.

Moreover, $C_4F_6/CH_2F_2/Ar$, $C_5F_8/CH_2F_2/Ar$, gas can be alternatively used as a main etching gas. The etch-target layer can be etched with 2-steps or 3-steps by not supplying $CH_2F_2$ gas or by reducing the amount of the $CH_2F_2$ gas which controls the amount of polymer in order to increase bottom CD.

Herein, an etching target is determined by the thickness of the etch-target layer 14 formed on the gate electrode 11 and the hard mask 12. In the preferred embodiment, the etching target is determined to be from about 20% to about 50% of the thickness of the etch-target layer 14.

In the preferred embodiment, a contact hole 18 that exposes a surface of the substrate 10 between the gate electrodes 11 through the selective etching of the etch-target layer 14.

Figure 4:
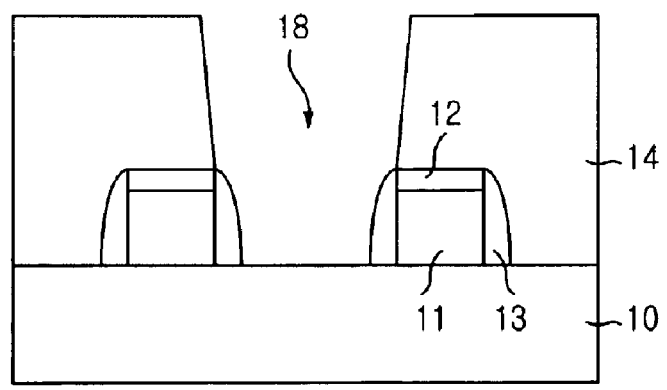

With reference to FIG. 4, a cleaning process is performed to eliminate by-products produced from a course of the SAC process, and then, the anti-reflective coating layer 15, the photoresist pattern 16 and the polymer 17 are also eliminated, completing a pattern formation process.

As shown in the above, during the formation of the photoresist pattern, transformations of the pattern caused by the etching process can be prevented. Instead, the preferred embodiment suggests a method for forming the micro photoresist pattern with minimally reduced transformations caused by the etching of the etch-target layer with etching the organic anti-reflective coating layer with proper controls of the etching gas and process variables, which, in turn, results in an adhesion of the polymer.

By following the preferred embodiment, it is possible to prevent transformation and losses of a photo resist (PR) pattern by employing the ArF photolithography, thereby, ultimately augmenting yields of semiconductor devices.

In addition, the preferred embodiment shows the formation of the contact hole. However, the disclosed method is also applicable for cases in forming a gate electrode pattern or storage contact wherein the etch-target layer is a conductive layer and for various shapes of the pattern in I-type, hole-type or closed type and so forth.

While the disclosed method has been described with respect to certain preferred embodiments, it will be apparent to those skilled in the art that various changes and modifications may be made without departing from the scope of the invention as defined in the following claims.

What is claimed is:

1. A method for forming a pattern of semiconductor device comprising:

forming an organic anti-reflective coating layer on a an etch-target layer already formed on a substrate;

coating a photoresist for ArF on the organic anti-reflective coating layer;

exposing the photoresist with ArF laser;

forming a first photoresist pattern by developing the photoresist, wherein portions of the organic anti-reflective coating layer are revealed;

etching the organic anti-reflective coating layer with the first photoresist pattern as an etch mask and forming a second photoresist pattern by attaching polymer to the first photoresist pattern, wherein the polymer is generated during etching the organic anti-reflection coating layer with an etchant including $O_2$ plasma; and etching the etch-target layer by using the second photoresist pattern as an etch mask.

2. The method as recited in claim 1, wherein the organic anti-reflective coating layer is etched with $O_2/N_2$, $CF_4/Ar/CO/O_2$, $CF_4/Ar/O_2$, $CE_4/Ar$, $CH_2F_2/Ar/O_2$, or $CHF_3/CF_4/Ar/O_2$ plasma.

3. The method as recited in claim 1, wherein the photoresist for for ArF includes cycloolefin-maleic anhydride (COMA) or acrylate.

4. The method as recited in claim 2, wherein of etching the organic anti-reflective coating layer is performed under conditions in which power and pressure are in a range from about 200 W to about 500 W and from about 10 mTorr to about 100 mTorr, respectively in case of using $O_2/N_2$ gas and flow quantities of $O_2$ and $N_2$ are in a range from about 5 SCCM to about 50 SCCM and about 100 SCCM to about 500 SCCM, respectively.

5. The method as recited in claim 2, wherein of etching the organic anti-reflective coating layer is performed with $CF_4/CO/Ar/O_2$ gas under conditions in which power and pressure are in a range from about 100 W to about 500 W and from about 10 mTorr to about 100 mTorr, respectively and a flow quantity of $O_2$ is in a range from about 10 SCCM to about 50 SCCM, a flow quantity of CF4 is in a range from about 50 SCCM to about 150 SCCM, a flow quantity of Ar is in a range from about 100 SCCM to about 500 SCCM and a flow quantity of CO in a range from about 10 SCCM to about 50 SCCM.

6. The method as recited in claim 2, wherein of etching the organic anti-reflective coating layer is performed with $CF_4/Ar/O_2$, $CF_4/Ar$, $CH_2F_2/Ar/O_2$, or $CHF_3/CF_4/Ar/O_2$ gas under conditions in which power and pressure are in a range from about 100 W to about 500 W and from about 10 mTorr to about 100 mTorr, respectively.

7. The method as recited in claim 1, wherein the etch-target layer comprises an oxide.

8. The method as recited in claim 7, wherein the step of etching the etch-target layer is performed with $C_4F_6/CH_2F_2/Ar/O_2$ as a main etching gas under conditions in which power and pressure are maintained in a range from about 800 W to about 1700 W and from about 20 mTorr to about 60 mTorr, respectively.

9. The method as recited in claim 8, wherein the main etching gas further includes Xe or He etching gases.

10. The method as recited in claim 9, wherein a volume ratio of the main etching gas to the $O_2$ gas is in a range from about 1.0:1 to about 3.0:1.

11. The method as recited in claim 1, wherein etching the organic anti-reflective coating layer is performed with device capable of providing induced coupled plasma(ICP), electro cyclotron resonance(ECR) or reactive ion etching (RIE).

12. The method as recited in claim 8, wherein at the step of etching the organic anti-reflective coating layer, the temperature of the substrate is maintained in a range from about −100° C. to about 10° C.

13. The method as recited in claim 8, wherein a flow quantity of the $CH_2F_2$ gas is in a range from about 1 SCCM to about 10 SCCM, a flow quantity of the $O_2$ gas is in a range from about 5 SCCM to about 50 SCCM and a flow quantity of the Ar gas in a range from about 10 SCCM to about 100 SCCM.

* * * * *

UNITED STATES PATENT AND TRADEMARK OFFICE
CERTIFICATE OF CORRECTION

PATENT NO. : 6,933,236 B2 Page 1 of 1
APPLICATION NO. : 10/306084
DATED : August 23, 2005
INVENTOR(S) : Sung-Kwon Lee et al.

It is certified that error appears in the above-identified patent and that said Letters Patent is hereby corrected as shown below:

On the Title Page:

Item (57), line 4, "layer on a an etch" should be -- layer on an etch --.

In Column 5, line 26, "layer on a an etch" should be -- layer on an etch --.

In Column 5, line 43, "$CE_4/Ar$" should be -- $CF_4/Ar$ --.

In Column 5, line 46, "photoresist for for ArF" should be -- photoresist for ArF --.

In Column 5, line 48, "wherein of etching" should be -- wherein etching --.

In Column 6, line 6, "wherein of etching" should be -- wherein etching --.

In Column 6, line 12, "CF4" should be -- $CF_4$ --.

In Column 6, line 17, "wherein of etching" should be -- wherein etching --.

In Column 6, line 44, "-100" should be -- -10 --.

Signed and Sealed this

Eleventh Day of December, 2007

JON W. DUDAS
*Director of the United States Patent and Trademark Office*